United States Patent [19]

Roskind

[11] Patent Number: 4,713,786
[45] Date of Patent: Dec. 15, 1987

[54] DIGITAL HARDWARE SELECTION FILTER

[75] Inventor: James A. Roskind, Palm Bay, Fla.

[73] Assignee: Harris Corporation, Melbourne, Fla.

[21] Appl. No.: 702,136

[22] Filed: Feb. 15, 1985

[51] Int. Cl.⁴ .............................................. G06F 7/02
[52] U.S. Cl. .................................................. 364/715
[58] Field of Search ........................ 364/715, 724, 786

[56] References Cited

U.S. PATENT DOCUMENTS

| | | | |
|---|---|---|---|
| 3,711,692 | 1/1973 | Batcher | 364/786 |
| 4,135,248 | 1/1979 | Bluzer | 364/715 |
| 4,399,517 | 8/1983 | Niehaus et al. | 364/786 |
| 4,513,440 | 4/1985 | Delman | 364/715 |

OTHER PUBLICATIONS

Ataman et al., "A Fast Method for Real-Time Median Filtering", IEEE Trans. on Acoustics, Speech & Signal Processing, vol. ASSP. 28, No. 4, Aug. '80, pp. 415–421.
Oflazer, "Design & Implementation of a Single Chip 1-D Median Filter", IEEE Trans. on Acoustics, Speech & Signal Processing, vol. ASSP-31, No. 5, Oct. 83, pp. 1164–1168.
Lougheed et al., "The Cytocomputer: A Practical Pipelined Image Processor", Proceeding 7th Annual International Symposium on Computer Architecture, 1980 IEEE.
Nodes et al., "The Output Distribution of Median Type Filters", IEEE Trans. on Communications, vol. COM-32, No. 5, May 1984, pp. 532–551.

Primary Examiner—David H. Malzahn
Attorney, Agent, or Firm—Antonelli, Terry & Wands

[57] ABSTRACT

A sort selection (e.g. median) filter for selectively sorting any data value within a set of N data values, processes all the data values by bit position, making a determination as to possible candidates for the data value to be sorted from the set on the basis of a prescribed relationship between the value of the bit for the bit position of interest and a sort selection control code. For processing the data values by bit position, the filter contains a plurality M of bit processing stages corresponding to the resolution of the data values being processed. Each processing stage, in turn, contains a plurality N of controlled bit modifiers. The sort selection code is coupled to the bit processing stages beginning with the most significant bit (MSB) processing stage, wherein the code is subjected to modification depending upon the values of the MSBs for all the data values and the above-mentioned prescribed relationship. In those instances where the relationship causes the sort selection to be modified, it is determined that the value of the bit of interest is a first binary value. In those instances where the relationship does not cause the sort selection code to be modified, it is determined that the value of the bit of interest is a second binary value. This process proceeds from the MSB processing stage sequentially through lesser significant bit processing stages to the least significant bit (LSB) processing stage. As a determination is made of the value of each bit at each processing stage, that decided upon bit value is retained so that when the processing by all bit stages is completed the assembled, decided-upon bit values correspond to that data value of the set to be sorted.

39 Claims, 7 Drawing Figures

DIGITAL HARDWARE SELECTION FILTER

FIELD OF THE INVENTION

The present invention relates in general to signal processing systems and is particularly directed to a scheme for obtaining the $n^{th}$ largest value from a set of data values, such as those representative of imagery data.

BACKGROUND OF THE INVENTION

In multisensor signal processing environments, such as those employed for imagery signal generation, statistical signal processing schemes are used to enhance the electrical signals that are representative of a desired target optical image and to suppress unwanted signals (noise) which represent background clutter. Commonly included within such schemes as a mechanism for accomplishing target/background separation is a data value selection filter, such as a median filter, that operates to extract a preestablished electrical amplitude value from a set of amplitude values that constitute an image, or some portion (window) thereof, as viewed by the opto-electronic transducer array of the optical imaging system. Typically, in this type of imaging system, the filtered image of the target is produced by eliminating or blanking most of the electrical noise which has a value significantly different than a prescribed value (e.g. the median) as established by the filter.

In copending application Ser. No. 393,331, now U.S. Pat. No. 4,513,440, filed June 29, 1982, entitled "Hardware Median Filter" by D. J. Delman, and assigned to the Assignee of the present application, there is described an improved configuration for a digital hardware median filter that enjoys substantially reduced hardware and signal processing complexity over conventional filtering mechanisms through a two-dimensional pipelined architecture that is capable of operating on a large number of imagery data inputs to produce a digital output word representative of the median value of the total set of imagery data applied to the filter.

For this purpose the filter contains a set of line buffers to which (pixel) data for an image of interest is applied, to define a segment or window within the overall image. This multibit data is then propagated through a set of n-pipelined filter processing sections (n being the number of bits/pixel). Each filter section examines a particular bit position of the windowed imagery data and decides which bit (zero or one) represents the majority bit for that bit postion. As a result of this decision the data bits of the stored pixel data are either simply transferred to the next downstream section, or they are converted to all ones or all zeros and then passed on to the next downstream section. The bit value that has been determined to be the majority value for that particular bit position is designated as the corresponding bit of the median value and temporarily buffered. After all the bit positions have been processed, the buffered, decided-upon bits for the respective bit positions are combined to produce an output (word) representative of the median value of all the pixels in the window.

SUMMARY OF THE INVENTION

The present invention provides an improvement over the above-referenced Delman filtering scheme through a mechanism that not only is capable of accomplishing median filtering of a large set of data values, but is capable of selectively sorting any data value in the set, in terms of its size relative to the remaining values of the set. For this purpose the present invention employs a filtering mechanism that processes all the data values by bit position, making a determination as to possible candidates for the data value to be "sorted" or "extracted" from the set on the basis of a prescribed relationship between the value of the bit for the bit position of interest and a sort selection control code. For processing the data values by bit position, the filter contains a plurality M of bit processing stages corresponding to the resolution (in terms of significant bits) of the data values being processed. Each processing stage, in turn, contains a plurality N of controlled bit modifiers, each configured of combinational logic, the number N corresponding for the number of data values of the set.

The sort selection code is coupled to the bit processing stages beginning with the most significant bit (MSB) processing stage, wherein the code is subjected to modification depending upon the values of the MSBs for all the data values and the above-mentioned prescribed relationship. In those instances where the relationship causes the sort selection to be modified, it is determined that the value of the bit of interest is a first binary value. In those instances where the relationship does not cause the sort selection code to be modified, it is determined that the value of the bit of interest is a second binary value. This process proceeds from the MSB processing stage sequentially through lesser significant bit processing stages to the least significant bit (LSB) processing stage. In accordance with the filtering mechanism of each processing state, once it has been determined that a data value of the set is no longer a candidate as the data value to be sorted, further participation by the bit values of the excluded data value in downstream bit processing stages is inhibited. As a determination is made of the value of each bit at each processing stage, that decided upon bit value is retained (delayed) so that when the processing by all bit stages is completed the assembled, decided-upon bit values correspond to that data value of the set to be sorted.

In order to process the same bit position of all the data values in the set together, but initiating processing with the MSB and sequentially proceeding through lesser significant bit positions, skewing between adjacent bit positions, and alignment of the respective bit positions of all data values is required. For this purpose, interfacing the parallel data lines, over which the multibit data values to be processed are sequentially coupled, and the filter is a delay circuit having (N−1) delay stages (e.g. an (N−1) shift register) the respective stages of which are coupled to respective ones of the controlled bit modifiers of the processing stages of the filter. For skewing the bit positions relative to each other, an additional (K−1) number of delays is provided in series with the input to each delay stage for a respective Kth bit position among the data lines. The insertion of delays at the front end of the shift register significantly reduces hardware complexity.

Within the filter itself each processing stage employs a multibit adder or summation unit for summing the number of one bits that are provided at the outputs of the controlled bit modifier circuits. For large numbers of data values to be processed (e.g. a 5×5 array of imagery pixel data yielding 25 data values) the processing (gate delay) time of the necessary addition becomes an important consideration. As an additional feature of the present invention, an arrangement of carry-save adders is used to perform that large numbered multibit addition. Each carry save adder takes 3(p) inputs and produces 1(p) and 1(p+1) output, where p denotes (significant) bit position. As a result, the number of lines between successive stages of adders is reduced by a factor of two-thirds. As a result of this "factor of two-thirds" per stage reduction, very few stages are needed and the total delay is small. Moreover, the speed of operation is reduced as compared to conventional ripple carry adder arrangements.

DETAILED DESCRIPTION

Figure 1:
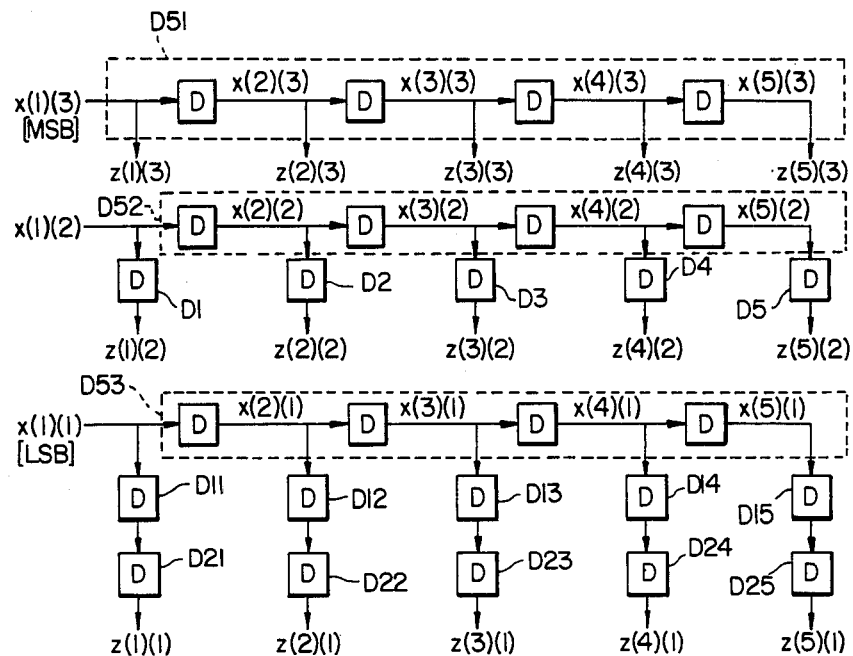
FIG. 1 shows a multi-stage delay circuit configuration for providing bit skewing and time alignment of common bit positions for a plurality of binary data values.

Before describing, in detail, the improved real-time digital hardware selection filtering scheme according to the present invention, it should be observed that the invention resides primarily in a novel structural combination of conventional digital circuit components and not in the particular detailed configurations thereof. Accordingly the structure, control and arrangement of such circuits have been illustrated in the Drawings by readily understandable block representations and schematic diagrams, which show only those specific details that are pertinent to the present invention, so as not to obscure the disclosure with structural details that will be readily apparent to those skilled in the art having the benefit of the description herein. Thus, the block diagram illustrations of the Figures do not necessarily represent the mechanical structural arrangement of the exemplary system, but are primarily intended to illustrate the major circuitry components of the selection filter in a convenient functional grouping, whereby the present invention may be more readily understood.

As pointed out previously, the selection filtering scheme of the present invention has a number of applications including, but not limited to, median filtering (preprocessing for automatic target classification) such as object pass filtering (one pass filtering that isolates objects of specific sizes or shapes and orientation); sorting/partial sorting of word parallel data (post processing of electro-optic derived transforms); and statistical filtering (deriving statistics of samples).

For purposes of describing an exemplary embodiment of the present invention, the application of the selection filtering scheme of the present invention will be explained with reference to an illustrative example of a median filter circuit configuration. It is to be understood, however, that the invention is not limited to median filtering or to the particular application described. It is, as mentioned above, applicable to any number of signal processing environments where a prescribed selection process for a set of data values is to be carried out. From the description of the median filter application and an explanation of modifications to accommodate other types of selection criteria a full appreciation of the application of the invention to a variety of signal processing tasks may be gained.

As described briefly above and as explained in the above-referenced copending Delman application, in the field of image processing median filters are commonly used as a preprocessing stage for automatic target classifiers. Their ability to remove impulse noise without smearing edges is extremely desirable, and a common configuration is that of a 5×5 median filter. A (5×5) median filter for imagery data processing is a scheme that extracts the median value of a (5×5) array of image pixels each have some shade of grey resolved into an M number of bits. Thus a (5×5) array would yield a plurality $N(=25)$ data values representative of various shades of grey, each data value being binary-encoded into M bits. In a pipelined system, such as described in the above-mentioned Delman application, and in which the present invention is readily utilized, the (N×M) array is converted into a sequence of N data values of M bits each for processing in a pipelined architecture.

In addition to their use in imagery data signal processing, median filters also have use in the field of speech processing as referenced in an article by Nodes and Gallagher entitled "The Output Distribution of Median Type Filters", IEEE Transactions on Communications, May 1984, pp. 532–541. From a practical standpoint, however, performing median type filtering in real-time on large windows of data has been an extremely difficult task. Advantageously, the selection filtering architecture of the present invention has the capability of handling large-sized windowed data values in real-time and thereby offers a practical tool for handling a variety of signal sorting/classifications problems (such as median filtering of imagery/speech data).

For purposes of facilitating an understanding of the configuration and operation of the selected filter of the present invention to be employed for extracting the median of a set of data values, consider an exemplary series of 5 data values each 3 bits in length. Thus, in the present example, N=5 and M=3. As an exemplary sequence, the binary values 001, 000, 111, 100, 011 (whose corresponding decimal equivalents are the values 1, 0, 7, 4, 3) will be used. Of course it is to be understood that the values of N=5 and M=3, as well as the numerical values of the data values themselves employed here are merely for purposes of providing an illustrative example of the operation of the selection filter of the present invention and are not limitative of its use.

As mentioned briefly above, the selection filter mechanism of the present invention processes data values supplied over a data link in a pipelined fashion. Typically the data link over which data values to be processed are coupled contains some M number of data lines corresponding to the resolution of the data (e.g. three lines for the present example of M=3 bits/data value). Thus, in the present example, the data link over which successive data values to be processed are supplied has a most significant bit (MSB) portion, a second most significant bit position portion, and a least significant bit (LSB) position portion. In order to carry out the selection filtering mechanism of the present invention to be described in detail below, it is first necessary to arrange the sequence of data values to be filtered such that the respective components of the data values, i.e. the bit positions, are formatted in a manner upon which the filter can operate.

Pursuant to the filtering scheme of the present invention, data values are analyzed or processed by bit position, most significant bit position first and least significant bit position last, with the same bit position for each data value of the sequence to be filtered processed at the same time. Because of the manner in which the contents (bits) of the data values themselves are formatted (in parallel) and because these parallel bits are supplied in serial groups, it is necessary to effect a time translation or conversion of both the individual bit positions of the data values, as well as the sequence of the data values themselves such that they are applied to the stages of the filtering mechanism in a format converse to that in which they are generated.

More particularly, as mentioned above, the filter operates on the same bit position for all data values at the same time. Unfortunately, the data values are supplied in sequence, so that for any bit position, all the bits for that position are supplied in sequence, rather than in parallel as is required for simultaneous processing. Secondly, for each data value, all the bits are delivered in parallel. However, the filter operates on the bit positions sequentially. Thus, there is a two-fold time alignment problem to be solved.

One scheme for accomplishing the desired alignment is shown in FIG. 1 as comprising respective sets of delay stages DS1, DS2, DS3 each of which contains a plurality of cascaded delay elements (e.g. flip-flops) D to which are coupled the respective bit lines over which the data value of interest are supplied. For the present example of five data values, four cascaded delay elements D per stage are required to provide successive time offsets among the successive data values, so that all the data values may be applied in parallel to the filter. Since, however, the filter operates sequentially for each bit position (of all the data values in parallel) it is necessary to provide the required offset for each bit position. For a three bit data scheme, this can be accomplished by adding a set of single bit delays D1–D5 to the outputs of delay stage DS2 and a set of double bit delays D11–D15, D21–D25 to the outputs of delay stage DS3 as shown in FIG. 1. Undesirably, however, this approach adds a considerable amount of circuitry for properly skewing each bit of each data value in order that the alignment of the respective bits of the data values for processing by the selection filter can be effected.

Figure 2:
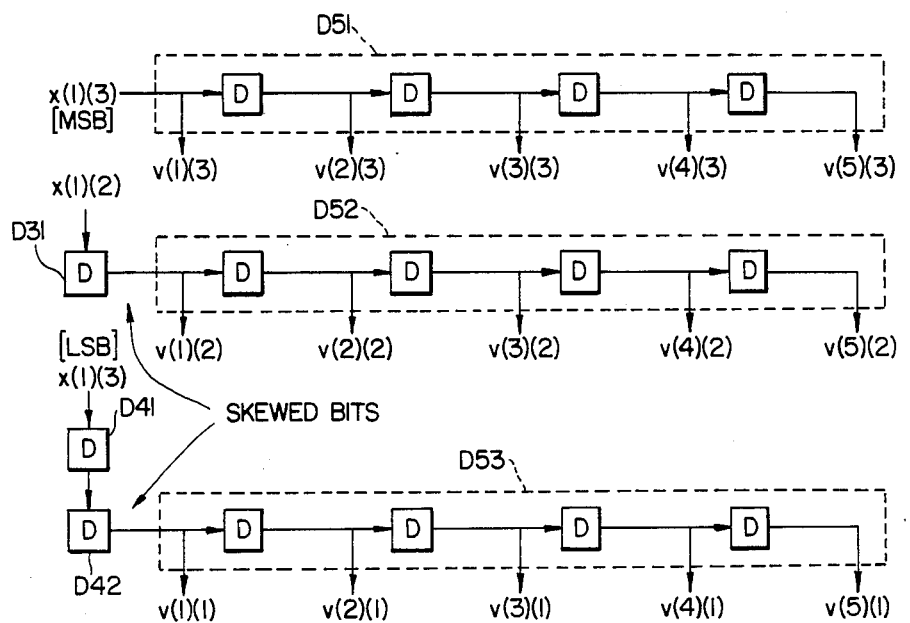
FIG. 2 shows a simplified multi-stage delay circuit configuration for carrying out the same effective skewing/alignment provided by the circuit of FIG. 1.

In accordance with one aspect of the present invention, rather than employ respective delays at the outputs of each of the delay stages to achieve the desired time alignment of all bits of the same position for all data values, but with respective bit positions successively skewed with respect to one another, this same effect can be achieved through the use of a prescribed $(K-1)$ bit delay at the front end of each delay stage DSK. As a result for the three bit resolution of the present example, only one additional single bit delay and one additional double bit delay respectively coupled to the inputs of delay stages DS2 and DS3, as shown in FIG. 2 are required. For the most significant bit delay stage DS1, the bit line is coupled directly to the sequence of cascaded delay elements D of stage DS1, so that the five MSBs of the five successive data values are supplied at outputs $X(1,3) \ldots X(5,3)$, simultaneously. For the second most significant bit delay stage DS2, the bit line is coupled to a single bit delay D31, the output of which is coupled to the sequence of cascaded delay elements D of stage DS2, so that the five second most significant bits of the five successive data values are supplied at outputs $X(1,2) \ldots X(5,2)$, simultaneously, but one bit time later than outputs $X(1,3) \ldots X(5,3)$ of delay stage DS1. Finally, for the least significant bit stage DS3, the LSB bit line is coupled to the cascaded dual bit delay stages D41–D42, the output of stage D42 being coupled to the sequence of cascaded delay elements D of stage DS3, so that the five LSBs of the five successive data values are supplied at outputs $X(1,1) \ldots X(5,1)$ simultaneously, but one bit time later than outputs $X(1,2) \ldots X(5,2)$ of delay stage DS2, and two bit times later than outputs $X(1,3) \ldots X(5,3)$ of delay stage DS3.

As will be appreciated from the skewing mechanism of FIG. 2, the same time alignment provided by the configuration of FIG. 1 is achieved but with a substantial savings in circuitry. Of course, where the number of data values to be processed changes, there is a corresponding change in the number of stages of each delay stage. Also, as the number of bits/data value increases, additional delay stages and front-end skewing is provided. (E.g. for a four bit resolution, an additional delay stage DS4 plus a front end skew of 3-bit time delay on its input line would be provided, the fourth delay stage corresponding to the LSB stage.) To illustrate the effect of the time bit skewing, data value alignment action of the mechanism of FIG. 2, for the five data value sequence 001, 000, 111, 100, 011, the respective bit values associated with each output $X(i,j)$ of the delay stages DS1–DS3 are shown in the Figure adjacent the outputs of the delay elements.

Figure 3:
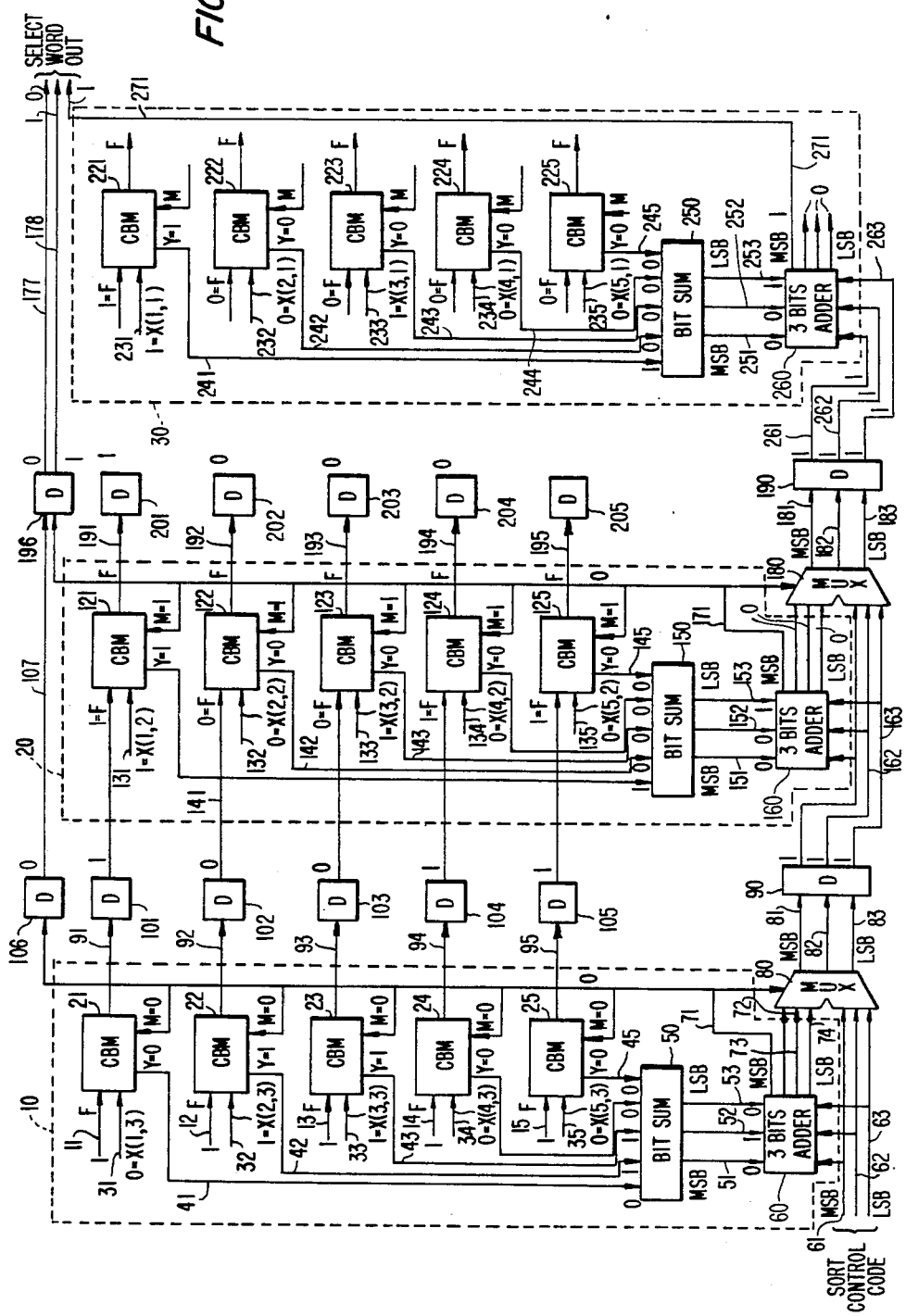
FIG. 3 is a schematic digital block diagram of a multi-stage 5×3 median selection filter.

Referring now to FIG. 3, the configuration of a sort selection filter in accordance with the present invention for selectively filtering (in the present example median filtering) an $(N=5)\times(M=3)$ set of data values is shown as comprising a cascaded arrangement of (three) bit position processing stages 10-20-30, each of which is associated with a respective one of the bit positions of the data values to be processed. For data values of a different number of significant bit positions, the number of stages will change accordingly; (i.e., for processing data values of five bits/value, for example, the selection filter would contain five bit position processing stages.)

Each bit position processing stage contains a set of controlled bit modifiers (the details of which will be described below with reference to FIG. 4) to one input of each of which a respective one of the $X(i,j)$ outputs of the skewing circuit of FIG. 2 is coupled. As will be explained in detail below, each controlled bit modifier operates to selectively modify the bit value coupled to it over input line $X(i,j)$ in accordance with the type of filtering operation to be performed and in accordance with the modification of a more significant bit for the data value with which that particular controlled bit modifier is associated. The number of controlled bit modifiers per bit position processing stage corresponds to the number N of data values to be filtered. In the present example there are N=5 (3-bit) data values to be processed, so that each of processing stages 10, 20 and 30 contains five controlled bit modifiers; stage 10 contains controlled bit modifiers 21–25, stage 20 contains controlled bit modifiers 121–125 and stage 30 contains controlled bit modifiers 221–225.

As pointed out briefly above the controlled bit modifiers are employed to selectively modify the data bits supplied over input lines $X(1,1) \ldots X(N,M)$, (here $N=5$, $M=3$), depending upon the type of filtering operation being executed and upon the value of the corresponding bit for a preceding (more significant) bit. For this purpose, each controlled bit modifier is configured in the manner shown in FIG. 4. As illustrated therein each controlled bit modifier has a "force input" line $F_{in}$, a data bit input line $X(i,j)$, a "force output" line $F_{out}$, a "modify" control line m and an output line Y. Force input line $F_{in}$ is coupled to one input of each of AND gates 301 and 302. Data bit input line $X(i,j)$ is coupled to a second input of AND gate 301 and one input of exclusive NOR gate 303. A second input of exclusive NOR gate 303 is coupled to "modify" control line m; its output is coupled to a second input of AND gate 302. The output of AND gate 302 is coupled to Force output line $F_{out}$.

Figure 4:
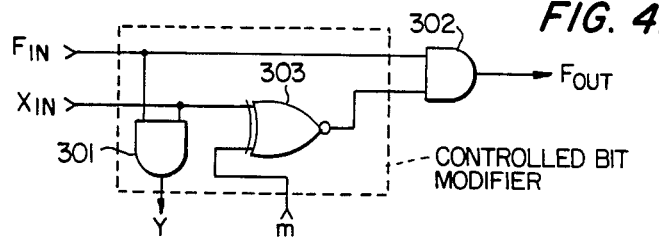
FIG. 4 is a digital circuit diagram of the makeup of a controlled bit modifier of FIG. 3.

In the configuration of FIG. 4, AND gate 301 serves to selectively permit a "1" bit on input $X_{i,j}$ to be coupled to a bit summation unit associated with the bit processing stage of interest. As will be explained in detail below, as the filtering process begins with the most significant bit position and proceeds sequentially through lesser significant bit positions to the least significant bit, a decision can be reached that the data value of interest is no longer a candidate as the data value to be extracted (or sorted out) by the selection filter. Once the decision is reached, the force output line from the controlled bit modifier for that bit position goes to zero and "forces", through the cascading of the force lines through AND gates 302 in subsequent controlled bit modifiers for the data value, the force inputs $F_{in}$ and force outputs $F_{out}$ of the remaining bits of the data value to be zero. This, in turn, prevents the associated AND gates 301 from coupling the $X_{i,j}$ bit values to their Y outputs and to the bit summation units that are used to sum up all the "1" bits provided at the Y outputs for a bit position of interest.

Control of whether or not a data value of interest remains a candidate as the data value to be extracted by the filter is determined by the value of $X_{i,j}$ for the bit position of interest and the value of a "modify" control input m, each of which is applied to NOR gate 303, as mentioned above. As will be explained in detail below, the logical state of modify control line m is governed by the result of adding a selection filter control code (the initial value of which is supplied to the processing stage 10 (the MSB stage) of the filter) and the output produced by the summation unit of the processing stage of the bit position of interest. Unless, as a result of this addition, a carry is generated, the logical state of modify control line m is a "zero". Accordingly, if the value of $X_{i,j}$ for that bit position is a "1", the output of exclusive-NOR circuit 303 will be a zero, thereby forcing the force line $F_{out}$ to zero and removing the data value as a candidate. Conversely, if the value of $X_{i,j}$ for that bit position in a "0", the output of exclusive-NOR circuit 303 will be a "one", so that (absent a previous force-to zero on input $F_{in}$ by an upstream bit processing stage) that data value remains a candidate for the data value to be extracted.

On the other hand, if as a result of the addition of the control code and the output of the summation circuit, a carry is generated, the logical state of modify control line m is a "one". Therefore, if the value of $X_{i,j}$ for that bit position is a "0", the output of exclusive-NOR circuit 303 will be a zero, thereby forcing the force line out $F_{out}$ to zero and removing that data value as a candidate. If the value of $X_{i,j}$ for that bit position is a "1", the output of exclusive-NOR circuit 303 will be a "one", so that (again, absent a previous force-to-zero on input $F_{in}$ by an upstream bit processing stage) that data value remains a candidate as the data value to be extracted.

Simply put, a logical "0" on modify control line m "kills" or removes as candidates data values whose current bit of interest $X_{i,j}$ is a "1", while a logical "1" on modify control line m "kills" or removes as candidates data values whose current bit of interest $X_{i,j}$ is a "0".

Referring again to FIG. 3, in addition to N controlled bit modifiers, each bit position processing stage also includes an N bit input summation unit and an M bit adder. In processing stage 10, the respective Y outputs of controlled bit modifiers 21–25 are coupled over lines 41–45 to the $N=5$ inputs of summation unit 50. Similarly, the respective Y outputs of controlled bit modifiers 121–125 are coupled over lines 141–145 to the $N=5$ inputs of summation unit 150. The respective Y outputs of controlled modifiers 221–225 are coupled over lines 241–245 to the $N=5$ inputs of summation unit 250.

N bit input summation units 50, 150 and 250 add the number of one bits applied to their respective input lines and supply three bit output codes representative of those sums on lines 51, 52, 53; 151, 152, 153; and 251, 252, 253 respectively, as first sets of inputs to respective adders 60, 160 and 260. A second set of three bit inputs for adders 60, 160 and 260 is derived from a respective 3-bit set of control lines 61, 62, 63; 161, 162, 163; 261, 262, 263. As will be described in detail below, it is through these control lines that the type of selection filtering to be carried out by the filter architecture of FIG. 3 is programmed.

Each of adders 60, 160, 260 provides a four bit binary output code on output lines 71–74, 171–174, 271–274 respectively corresponding to the sum of the codes on 3-bit line pairs (51–53)/(61–63), (151–153)/(161–163), (251–253)/261–263). The most significant bit line 71 at the output of adder 60 is coupled to the "modify" control input m of each controlled bit modifier 21–25, to one bit delay stage 106 and to the control input of a multiplexer 80. Multiplexer 80 is a three-bit in/three-bit out switch that couples either the three least significant bit lines 71–74 from adder 60 or lines 61–63 to output lines 81–83. Output lines 81–83 are coupled through a 1-bit time delay stage 90 to lines 161–163. The output of one bit delay stage 106 is coupled over line 107 to a second one bit delay stage 196, to provide on output line 177 the value of the most significant bit of the output of adder 60, but delayed by two bit times (to account for the processing times of stages 20 and 30) for successively delayed second most significant bit and least significant bit data values $X(1,2) \ldots X(5,2)$ and $X(1,1) \ldots X(5,1)$, respectively.

Each of the force input lines 11–15 of controlled bit modifiers 21–25 is hardwired to a voltage level representative of a logic level one. Respective inputs 31–35 of controlled bit modifiers 21–25 are coupled to receive the respective MSB bit values $X(1,3) \ldots X(5,3)$ of the set of data values to be processed. The force out $F_{out}$ outputs of controlled bit modifiers 21–25 are coupled over respective lines 91–95 through delay elements 101–105 to the force-in $F_{in}$ inputs of controlled bit modifiers 121–125 of the second most significant bit processing stage 20. The force-out $F_{out}$ outputs of controlled bit modifiers 121–125 are coupled over lines 191–195 through delay elements 201–205 to the force-in $F_{in}$ inputs of controlled bit modifiers 221–225 of least significant bit processing stage 30. Respective inputs 131–135 of controlled bit modifier 121-125 are coupled to receive bit values X(1,2) ... X(5,2).

The "modify" control input m of each of controlled bit modifiers 121-125 is coupled to the most significant bit output 171 of 3-bit adder 160. Like adder 60 in stage 10, adder 160 sums the outputs of its attendant bit summation unit 150 and the contents of lines 161-163. Bit summation unit 160 has five inputs respectively coupled to the five Y output lines 141-145 of controlled bit modifiers 121-125, and provides a three-bit binary output code on lines 151-153 representative of the sum of the number of "1" bits provided over lines 141-145 from the five Y outputs of controlled bit modifiers 121-125. The three least significant bit outputs of adder 160 are coupled as one set of inputs to three-bit in/three-bit out multiplexer 180. The most significant bit output of adder 160 is coupled over line 171 to the control input of multiplexer 180, to the "modify" control inputs m of controlled bit modifiers 121-125 and through a one bit delay stage 196 to output line 178. The second set of inputs of multiplexer 180 is supplied by lines 161-163. The three-bit output lines 181-183 of multiplexer 180 are delayed one bit time by delay stage 190 and coupled over lines 261-263 to three-bit adder 260 of least significant bit position processing stage 30.

The force-out $F_{out}$ outputs of controlled bit modifiers 121-125 of processing stage 20 are coupled over lines 191-195 to one bit delay stages 201-205, the outputs of which are respectively coupled to the force-in $F_{in}$ input of controlled bit modifiers 221-225 of least significant bit position processing stage 30. The LSB data values are supplied to lines 231-235; the Y outputs of controlled bit modifiers 221-225 are respectively coupled over lines 241-245 to summation unit 250. Like bit summation units 50 and 150, summation unit 250 provides a three bit output on lines 251-253 representative of the total number of "one"s at the Y outputs on lines 241-245 of controlled modifiers 221-225. This three bit code is added to that supplied over lines 261-263 and the most significant bit of the sum is supplied over line 271. The other three bits of the output of adder 260 are unused, as there is no further downstream (lesser significant bit position) processing stage. By the same token the force-out $F_{out}$ and "modify" m inputs of controlled modifiers 221-225 of stage 30 are shown as being unused since, in the present example, there are no additional processing stages. However, in some applications, such as optoelectronic signal processing systems, where the actual location within the filter of the data value to be extracted is a sought-after parameter, the force output lines of the least significant bit stage 30 can be used to determine such actual physical location within the filter where the data value to be extracted is located. In this instance the carry output line 271 from adder 260 is coupled to the modify "m" inputs of each of controlled bit modifiers 221-225. The location of the filtered-out or extracted data value will be indicated by the presence of a logical "1" at the force output line $F_{out}$ of the associated one of controlled bit modifier stages 221-225. If the actual value of the filtered data value is possessed by more than one data value (e.g. for a median among the values 1,1,2,2,2, the median value 2 is equal to three data values) then the force output port $F_{out}$ of three controlled bit modifiers will be a logical "1".

As will be explained below, the binary code defined by the logical state of the carry or m bits on lines 177(MSB), 178, 271 (LSB) represents the desired or selected data value from among the plurality of data values processed by the selection filter. For a median filtering operation chosen as the present example, the value of the binary code on lines 177, 178, 271 represents the median of the (N=5) data values processed by the filter.

As mentioned briefly above, depending upon the type of selection operation the filter shown in FIG. 3 is to conduct, the binary control code represented by prescribed logical input levels applied to control lines 61, 62 and 63 will vary. In effect, the purpose of these control lines, and the subsequent control lines 161, 162 and 163 and lines 261, 262 and 263, is to apply a 3-bit code to each of adders 60, 160 and 260 that will cause a carry to be generated when a prescribed condition associated with the type of sorting function to be carried out by the filter occurs. In the present example, the filter is to be employed as a median filter. Since the number of data values the median of which is to be extracted is equal to five, then it necessarily follows that the filter will be looking for the third largest of the 3-bit binary codes applied to it over lines X(1,1) ... X(5,3). For designating the type of operation to be conducted by the filter for a group of five input data values that are to be sorted (here median filtered) the following table can be established from which the value of the control code applied to input lines 61-63 can be determined.

TABLE

| CONTROL CODE ON LINES 61-63 | FILTERING FUNCTION TO BE EXECUTED |
|---|---|
| 111 | Select largest valued data value |
| 110 | Select second largest data value |
| 101 | Third largest (or median data value) |
| 100 | Fourth largest data value |
| 011 | Fifth largest data value |

OPERATION

Considering now the operation of the circuit of FIG. 3 as a median filter, the sorting code established according to the above table the binary code 101 the respective bits of which are applied to lines 61, 62 and 63, respectively. The respective data values produced over output lines X(i,j) will reflect the various bit values for the five 3-bit code data values the median of which is to be extracted. The binary values of the input lines to the respective controlled modifier stages 21-25, 121-125, 221-225 are shown adjacent the input lines X(i,j) in FIG. 3 to facilitate an understanding of the present description of the operation of the invention.

In processing the data bit values of the respective bit positions, the filter operates on the most significant bit position first and then proceeds sequentially to successive lesser significant bit positions. In the left-hand portion of FIG. 3, wherein stage 10 is associated with the most significant bit position of the three bits of the five 3-bit data values to be filtered, each of the force-in lines $F_{in}$ is hardwired to a logical "one", as pointed out previously. The force-in line $F_{in}$ and the data bit line X(i,j) for each controlled bit modifier are ANDed by AND circuit 301 (see FIG. 4 described above) and the resulting output Y is produced over a respective one of output lines 41-45 and applied to the respective inputs of summation circuit 50. The results of these ANDing operations are shown as respective binary logics levels (0 or 1) for the respective Y output lines 41-45 in FIG. 3. Summation circuit 50 counts the number of ones applied to it and provides a 3-bit binary code over output lines 51–53 representative of the number of ones it has counted. Since there are two ones applied to the input of bit summation circuit 50, the code over output lines 51–53 is the binary code 010. This three bit code is summed in adder 60 with the control code 101 applied over lines 61–63 and the output of adder 60 is produced over lines 71–74. The sum of the two input codes is the binary value 011, so that the most significant bit line 71 is a zero, whereas the lesser significant bit lines 72–74 contain all ones.

The zero value on the most significant bit line 71 is applied as a "modify" control input m to each of control modifier stages 21–25 and to the delay stage 106. As pointed out above in connection with the description of the details of the controlled bit modifier circuit shown in FIG. 4, the presence of a logical "0" at the modify input m of the controlled bit modifier "kills" or removes as candidates those data values whose bit value for the bit position of interest is a "1". Here, for the MSB processing stage 10, this means that data values 111 and 110 are to be removed as candidates as the median data value to be extracted. Thus, force output lines $F_{out}$ 92 and 93 from controlled bit modifiers 22 and 23 go to zero and force the Y outputs and the force outputs $F_{out}$ of downstream controlled modifiers 122-222 and 123-223 to zero. This action, in effect, leaves only data values 000, 001, 011, namely those with a "0" as the MSB, as possible candidates as the median data value.

In addition to the above action, the logical "0" on line 71 also causes multiplexer 80 to couple the three bit binary code on lines 72–74 to output lines 81–83 to delay 90, and its delayed output code is applied over lines 161–163 as a "new" selection filter control code to adder 160 of processing stage 20. This "new" control code resulted from the removal of two of the original five data values as candidates as the median, and the binary value (111) of the "new" code reflects the fact that the filter is now looking for the largest valued data value of those remaining (000, 011, 001), as defined by the control code definitions listed in the above Table.

Since each of the remaining data values (000, 011, 001) remains a candidate as the median value to be extracted, the logical state of each of force-out lines $F_{out}$ 91, 94, 95 will be a "1", as shown. These lines are coupled through delays 101, 104, 105 to the force inputs $F_{in}$ of controlled bit modifiers 121, 124, 125 of the second most significant bit processing stage 20. Also, line 71, the logical state of which represents the logical value of the most significant bit of the median data value to be extracted, is coupled to delay 106.

The action of delay stages 106, 101–105 and 90 is to delay the results of the processing of the most significant bits of the five 3-bits numbers of interest one bit delay time for the first stage to account for the skewing carried out by the circuitry of FIG. 2, discussed above.

With the MSB processing stage 10 of the selection filter having determined the value of the MSB of the data value to be extracted (here a "0" as indicated by the logical "0" state of line 71), the filter nexts processes the next bit position of the remaining data values (data values 111 and 100 having been removed as candidates by the action of force lines 92, 93). In effect the filter is now looking for the largest binary value of the reduced codes (00, 11, 01). This action is carried out by looking for a "1" in the highest bit position of the remaining candidates, i.e. the presence of a "1" in the next most significant bit position of the original data values 000, 011, 001.

Considering now this action of the next most significant bit processing stage 20, AND circuit 301 within each of the controlled bit modifier stages 121-125 produces the logical product of the force input $F_{in}$ lines 111-115 and the value of the data bits over the next most significant bit lines X(1,2) . . . X(5,2). It will be noted that it is only controlled bit modifier 121, associated with the bit value X(1,2)=1, that has both its force input line $F_{in}$ 111 and its bit input line X(1,2) at a logical "one" level, so that only Y output line 141 will produce a "one". The remaining Y output lines 142-145 from controlled bit modifiers 122-125 are all zeros. Accordingly, bit summation circuit 150 produces the output code 001 on output lines 151-153 to be summed with the "new" code (111) on lines 161-163 from delay stage 90. The addition of the two codes (001) and (111) produces the output code 1000 on lines 171-174 of adder 160. Since the logical level of the most significant bit line 171 is a "one", multiplexer 180 couples output lines 181-183 to input lines 161-163 to apply the code (111) through delay stage 190 and then to lines 261-263 at the input of adder 260. The logical one level on line 171 (which represents the binary value of the next most significant bit of the median data value to be extracted) is also applied to one of the inputs of delay stage 196. The other input of delay stage 196 is the value "zero" on line 107 from the processing of the most significant bit, discussed above. Each of these bits (01) is delayed by the one bit delay time provided by delay stage 196 and then applied to respective output lines 177 and 178.

Because the modified bit m on line 171 applied to each of controlled bit modifiers 121-125 is a "one", then for any data bit input X(i,j) whose value is also a "one", one of the inputs to the AND circuit 302 within those modifiers 121-125 the outputs of which are coupled to the force ($F_{out}$) output lines 191-195, will depend upon the logical level of the force input lines $F_{in}$ 111-115. As shown in FIG. 3, it is only at stage 121 where both the logical value of the data input X(1,2) and the logical level of the modify line m 171 are "one"s. For each of the remaining stages 122-125, gate 302 (FIG. 4) does not receive a "one" at both its inputs. Accordingly, it is only on force output line $F_{out}$ 191 of the next most significant bit stage 20 that a logic level one appears. The remaining force output $F_{out}$ lines 192 and 195 are all zeros. Each of these logic signals is delayed by a one bit delay time in delay stages 201-205 and then applied to the force inputs $F_{in}$ 211-215 of controlled bit modifiers 221-225 of LSB processing stage 30. Since it is only force input line $F_{in}$ 211 for modifier stage 221 that has a logic level "one", the Y outputs of all of the other stages 222-225, applied over output lines 241-245, must necessarily be zeros. Since the data bit value of input X(1,1) is also a "one", the Y output value on line 241 is therefore a "one". As a result, bit summation circuit 250 sums the single "one" provided on Y output line 241 from controlled bit modifier 221 and the four zeros provided on lines 242-245 and provides the output code (001) over output lines 251-253. This code (001) is added to the code (111) applied over lines 261-263 to produce a carry (or 1) on output line 271, as shown. This carry bit represents the bit value of the LSB of the data value to be extracted. Because of the delays provided by delay stages 106, 101-105, 90 and delay stages 196, 201-205 and 190, the logic levels on lines 177, 178 and 271, (i.e. code 011 corresponding to median data value to be extracted from the data value set of interest) are provided simultaneously.

As pointed out briefly above, because of the action of the force lines effectively eliminating all data value candidates except the actual data value to be extracted, it is possible to use the force output lines of the least significant bit stage to locate where in the filter the extracted data value is located. In this case, carry-out line 271 from adder 260 is coupled to the modify "m" control ports of controlled bit modifiers 221-225. For the present example, an examination of the force output ports $F_{out}$ of controlled bit modifiers 221-225 will reveal that a logical "1" is present at the force output port $F_{out}$ of only controlled bit modifier 221. Accordingly, it is known that the extracted data value (011) is associated with input bit lines X(1,3), X(1,2), X(1,1) or the "top-of-stack" as viewed in FIG. 3.

Where it is desired to change the selectivity or the sorting function carried out by the filter of FIG. 3, it is simply a matter of changing the sort control code on lines 61-63 in accordance with the table set forth above. It can be seen, therefore, that in addition to median filtering, the data value filtering scheme according to the present invention is capable of object pass filtering (that isolates objects of specific sizes or shapes and orientation, as governed by the control code), the sorting or partial sorting of word parallel data, and as a statistical filter. Depending upon the window or number of data values to be sorted, as well as the size of each data value (in terms of its binary bit resolution) the number of stages within the filter and the number of bit lines employed will vary. As pointed out previously, the above example has been described an exemplary embodiment of a sort selection filter for filtering out or extracting the median of five, three-bit data values. The number of bits per data value is represented by the number of bits of the control lines 61-63, 161-163, 261-263 and the number of bit positions or stages 10, 20, 30 . . . As the number of variables to be processed changes, the number of controlled bit modifiers for each respective bit position will change accordingly.

From the above description of the configuration and operation of the selection filter scheme of FIG. 3, it will be recalled that in the course of the operation of each bit position processing stage (10,20,30), a summation of the Y outputs of each of the controlled bit modifier units is required. For the example of FIG. 3, where the (median) filtering function is executed with respect to a total of five data values, processing stages 10, 20 and 30 contain five-input summation units 50, 150 and 250, respectively, the outputs of which are multibit codes of sufficient length (here three) to encode (binary) the maximum number (here five) of "1" bits that may be applied to the bit summation units. Namely, the summing capacity of each bit summation unit must be able to accommodate the total number of data values to be filtered. In the present example, where only five data values have been chosen for purposes of simplifying the description, the complexity (in terms of gate delays) of bit summation units is effectively trivial. However, for significantly larger numbers of data values, such as a (5×5) pixel array of imagery data (which translates into 25 data values) the make up of the bit summation circuit may impact the complexity and processing speed of the overall filter.

In accordance with a further aspect of the present invention, the bit summation units are principally configured of arrangements of carry-save adders, so as to reduce the processing time that would be otherwise carried out were the bit summation units comprised of ripple carry adders that have been conventionally employed for large quantity binary addition.

In order to facilitate an understanding of this aspect of the present invention consider the addition of an exemplary set of numbers (9, 5, 15). In decimal-binary representation the addition may be defined as:

| 9 | 1001B |
|---|---|
| 5 | 0101B |
| +15 | +1111B |
| 29 | 11101B |

If, in the process of executing the binary addition, individual adds were carried out, but the carrys forwarded from each column to the next were not added in, there would be obtained the following:

| | 1001B |
|---|---|
| | 0101B |
| | +1111B |
| The carries are | 1101XB |
| The sums are | 0011B |

The operation just performed takes three binary numbers (1001B, 0101B, 1111B) and obtains two binary numbers (1101×B, 0011B) that have the same sum. An interesting aspect of this operation is that the size of the numbers is irrelevant to the time required to perform the operation. By saving the carry, there is no ripple carry effect despite the fact that the quantity of binary numbers that must be added together has been reduced by two-thirds.

After carry save additions are performed many times on a large list of numbers, there eventually remains a pair of binary numbers that still must be added together the slow way (ripple carry method or fast add method). However, prior to that point in the operation the delay imparted by ripple carry addition can be substantially reduced.

Figure 5:
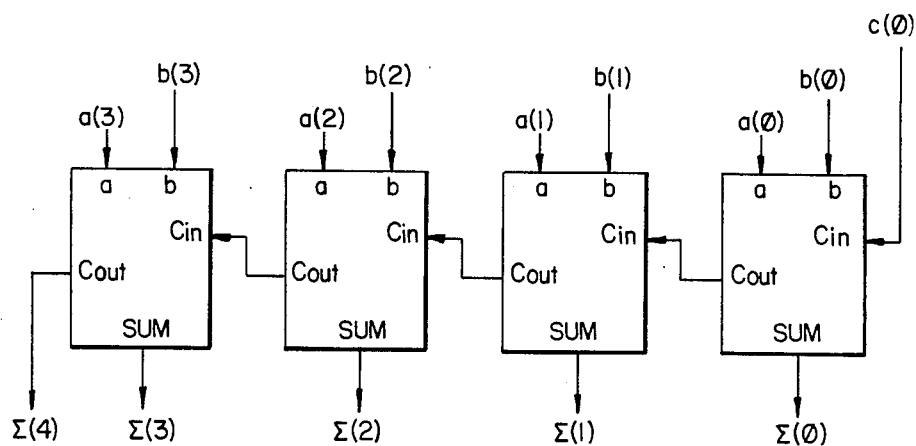
FIG. 5 shows a four bit ripple carry circuit.

An additional advantage of carry save adders is the ease with which they are implemented in digital logic. Each stage of a ripple carry adder (generally called a full adder) has three inputs: a, b and $c_{in}$ (carry-in) as illustrated in FIG. 5 which shows the configuration of a four bit ripple carry adder. The a and b inputs receive the bits to be added to that stage of the adder. The $c_{in}$ input receives the carry out ($c_{out}$) from the next lowest significant bit stage, while the sum output provides the sum of a, b and $c_{in}$ (without the carry which is produced on $c_{out}$).

Figure 6:
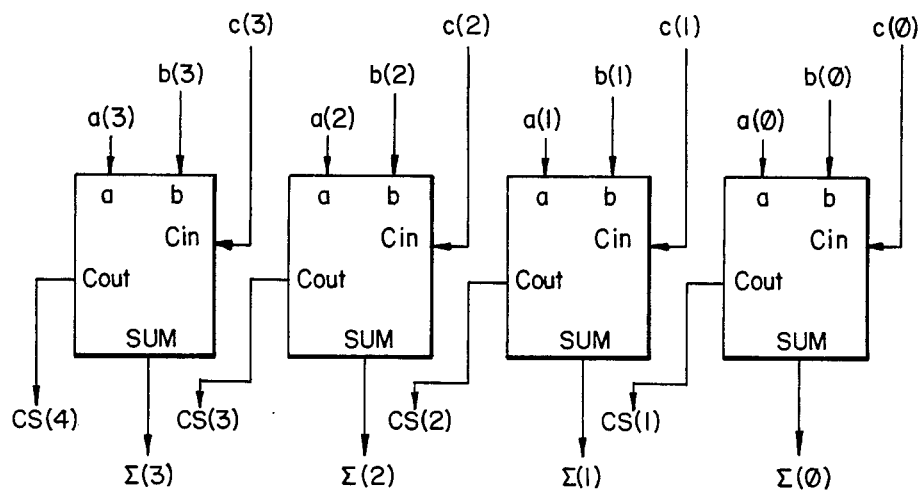
FIG. 6 shows an arrangement of four carry-save adders for processing four, three-bit inputs.

The ripple carry adder, such as that shown in FIG. 5, can be easily reconfigured to form a carry save adder simply by cutting the carry lines between consecutive stages of the adder, as shown in FIG. 6. The outputs of the adder are now considered to be the sum outputs and also the $c_{out}$ (termed carry save or cs) outputs, while the inputs are simply termed a, b, and c, respectively associated with the a, b and $c_{in}$ inputs. Upon close examination it will be seen that the carry save adder configuration of FIG. 6 provides the two separate sum and carry numbers suggested by the example described above. Namely, the carry save adder of FIG. 6 takes in three four bit numbers a(3-0), b(3-0), c(3-0) and produces two four bit numbers $\Sigma$(3-0), cs(4-1). (Note that the carry number does not have a bit in the "$2^0$" bit position. In general terms it can be seen that for any respective bit position, a one bit (position) carry save full adder takes, as its input, three bits from the $2^p$ bit position, and produces one bit in the $2^p$ column, and one bit in the $2^{(p+1)}$ column. As a shortened variation, it may be restated that a carry save adder takes three-(p) bits of input and produces one-(p) bit and one(p+1) bit.

In order to illustrate the processing power obtained by using carry save adders instead of ripple adders to sum a large number of data values, consider the above example of a (5×5) pixel window for filtering imagery data (varying shades of grey/pixel) using a selection filter of the present invention, of the type illustrated in the example of FIG. 3 (wherein five data values are filtered rather than the twenty-five now considered; a (5×5) window produces 25 data values to be filtered). Each of the data values represents some shade of grey resolved into a prescribed number of bits. Thus, using the example of a median filter, for five bit resolution, the filter configuration corresponding to that shown in FIG. 3 would have a total of five bit position processing stages, each containing 25 controlled bit modifiers. For selecting the median value among the 25 data values, the sort selection control code would be 01111 (using two's complement arithmetic to generate a carry as described with reference to the above Table). For encoding a total of twenty-five input lines to be summed, each summation unit has twenty-five input lines I(24) . . . I(0) and five output lines O(4) . . . O(0).

Figure 7:
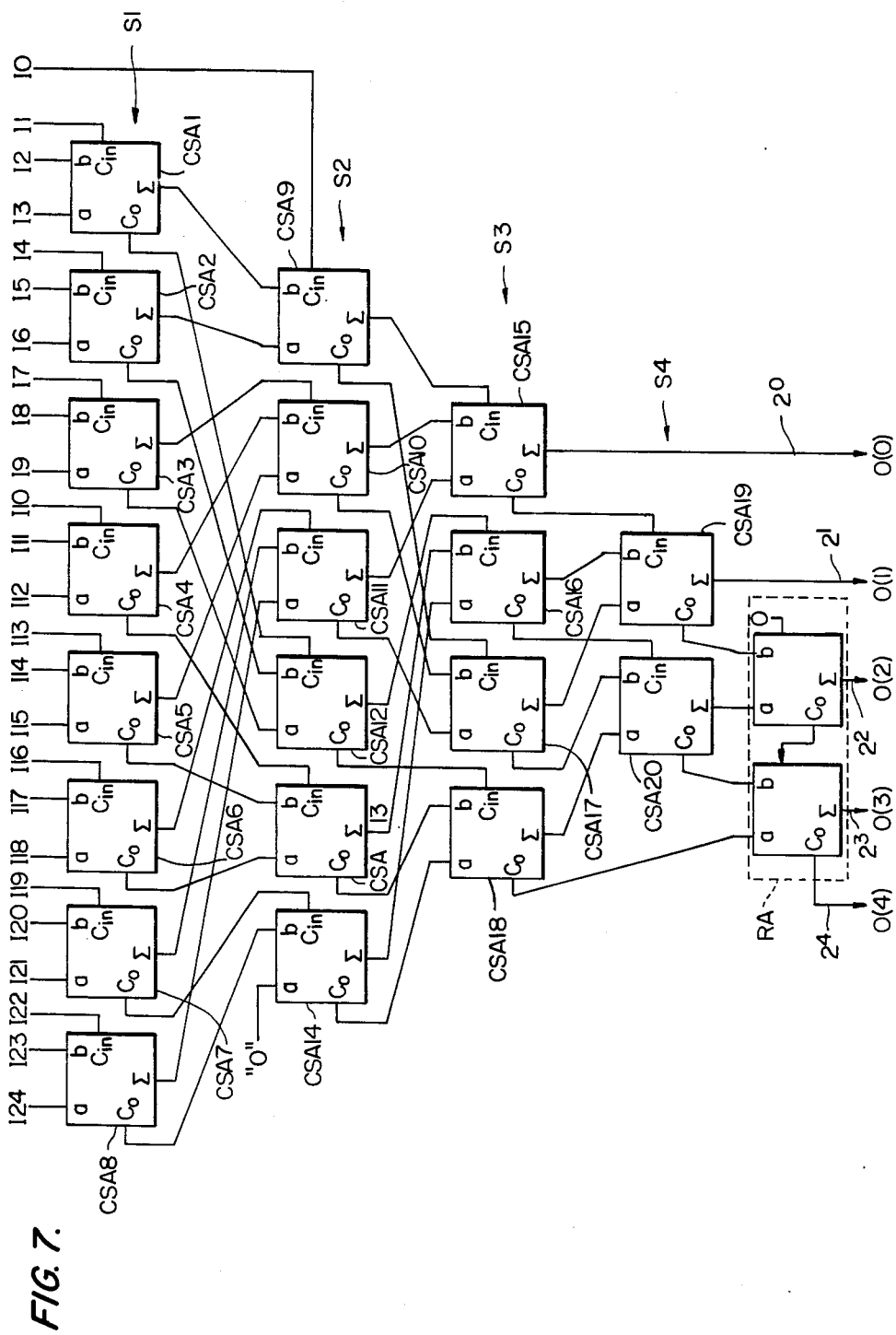
FIG. 7 shows the configuration of a twenty-five input bit summation circuit employing carry save adders.

Referring now to FIG. 7 the configuration of such a summation unit principally employing carry save adder stages will be described. As shown therein there are twenty-five input lines I(0) . . . I(24) to which binary (Y) values ("1" or "0") from the Y outputs of the controlled bit modifiers for a respective bit position of the filter are applied. Since a single carry save adder has three inputs, accommodating the twenty-five inputs I(0) . . . I(24) can be "substantially" effected with eight carry save adders CSA1–CSA8 of a first stage S1, whose 24 inputs are respectively coupled to inputs I(1) . . . I(24) as shown. The LSB input I(0) is accommodated by a second stage S2 of carry save adders to be described to complete the processing of the twenty-fifth bit. Since, as noted above, each carry save adder produces a 1(p) bit and a 1(p+1) bit from 3(p) bits of input, then it can be seen that stage S1 produces 8(1) bits and 8(0) bits, with the 1(0) bit on line I(0) as yet unprocessed. The 8(1) bits are produced at the $c_{out}$ outputs of CSAs 1–8, while the 8(0) bits are produced at the Σ outputs of CSAs 1–8.

To accommodate this total of 16 outputs ($c_{out}$ and Σ) produced by CSAs 1–8, second stage CSAs will be required. These are shown in FIG. 6 as CSAs 9–14 of a stage S2. Since each carry save adder processes bits of the same significance, the inputs to CSAs 9–14 are coupled to the outputs of CSAs 1–8 such that CSAs 12–14 add the 8(1) bits and CSAs 9–11 add the 8(0) bits. In addition, CSA 9 is coupled to receive the 1(0) bit, not processed by stage S1, to complete the nine inputs of CSAs 9–11 and a zero is coupled to one of the inputs of CSA 14, thereby completing the coupling of eighteen bit values to the eighteen inputs of CSAs 9–14. As shown in FIG. 7 one of the outputs of each of CSAs 9–14 has a bit in the $2^1$ position. Also each of CSAs 12, 13, 14 produces an output in the $2^2$ position, while each of CSAs 9, 10, 11 produces an output in the $2^0$ position.

These outputs are coupled to a third carry save adder stage S3 comprised of four CSAs 15–18 to accommodate the twelve outputs (3(2), 6(1), 3(0)) of stage S2. For this purpose the three inputs of CSA 15 are coupled to receive the three $2^0$ outputs of stage S2, the six respective inputs of CSAs 17 and 16 are coupled to receive the $2^1$ outputs of stage S2, while the three inputs of CSA 18 are coupled to receive the $2^3$ outputs of stage S2. From CSAs 15–18 there are produced one $2^0$ bit, three $2^1$ bits, three $2^2$ bits and one $2^3$ bit. Since the $2^0$ bit has now been exclusively defined, it is coupled to an output line O(0). To process the three $2^1$ and $2^2$ bits an additional carry save adder stage S4 is employed. In stage S4, CSA 19 receives the three $2^1$ bits from stage S3 and CSA 20 receives the three $2^2$ bits produced by stage S3. CSA 19 produces one $2^1$ output and one $2^2$ output, while CSA 20 produces one $2^2$ output and one $2^3$ output. With the $2^1$ output now being exclusively defined it is coupled to output line O(1).

At this point in the process the use of CSAs is no longer an advantage over a ripple carry adder. Since the two lower order bits ($2^1$ and $2^0$) are already provided, the addition process can be completed by combining the pairs of $2^3$ and $2^2$ bits in a 2-stage ripple adder RA, as shown. The ripple adder RA produces the $2^4$, $2^3$ and $2^2$ bits which are coupled to output lines O(4), O(3), O(2), respectively, which, together with lines O(1) and O(0), provide a five bit binary sum of input lines I(0) . . . I(24).

From an analysis of the multi-stage use of carry save adders in the foregoing example, it can be seen that the process of adding 25 one bit numbers requires four stages of CSA utilization, and only one stage (S5) where a two bit add is performed. This results in a total delay of six times the delay imparted by a single one bit add and is all that is needed to sum twenty-five inputs. The total amount of hardware is 20 CSAs and one two bit adder, or about 22 times the hardware needed in a one bit full adder. Because of the reduction in gate complexity using carry save adders, at each stage of the summing process where CSAs are employed the number of lines to be summed is decreased exponentially (⅔ per stage).

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A signal processing apparatus for processing a plurality N of M multi-component information signals to produce therefrom a multi-component output signal representative of a controllably selected one of said mulit-component information signals comprising:

a multiplicity M of signal component processing stages, each respective one of which is associated with a prescribed one of the components of said multi-component information signals and is coupled to receive that prescribed signal component of each of said plurality of multi-component information signals and a respective control signal, so as to produce therefrom that signal component of said multi-component output signal that is associated with said prescribed one of said components of the selected one of said multi-component information signals;

means, responsive to a variable input signal representative of a selected pth largest of said plurality of multi-component information signals to which said selected one of said multi-component information signals corresponds, for coupling respective control signals to said multiplicity of signal processing stages; and combining means for combining the respective M signal components produced by said multiplicity M of signal component processing stages, whereby from said multiplicity M of signal component processing stages there is produced said selected pth largest of said multi-component information signals.

2. A signal processing apparatus according to claim 1, further including means for coupling the same component of each of said information signals in prallel to the same respective one of said processing stages, and coupling respectively different components of each of said information signals to respectively different ones of said processing stages at respectively different instances in time.

3. A signal processing apparatus according to claim 2, wherein said plurality N of multi (M)-component information signals are successively coupled thereto over M parallel signalling links, and wherein said component coupling means includes an arrangement for orienting the order of said N signals and the multiple components thereof said arrangement comprising:

a multiplicity M of first delay stages each respective one of which is disposed to be coupled to one of said M parallel signalling links, each first delay stage comprising (N-1) delay elements coupled in series; and a multiplicity M of second delay stages each respective of which is coupled between a respective Kth one of said signalling links and a respective Kth one of said first delay stages, each second delay stage comprising (K-1) delay elements coupled in series, where $1 < K < M$.

4. A signal processing apparatus according to claim 3, wherein each of said information signals corresponds to an M-bit digital word and the components of each information signal correspond to the respective bit positions thereof.

5. A signal processing apparatus according to claim 3, wherein the delay times imparted by the delay elements of said first delay stages are such that the Kth signal component of each of said N information signals as coupled over a Kth one of said M parallel signalling lines is provided at the output of a respective one of the delay elements of the Kth first delay stage coupled thereto at the same time.

6. A signal processing apparatus according to claim 5, wherein the delay times imparted by the delay elements of said second delay stages are such that the Kth signal component of a respective one of said N information signals is skewed in time relative to a Jth signal component of said respective one of said N information signals, where $1 < J < M$ and $J \neq K$.

7. A signal processing apparatus according to claim 6, wherein each of said information signals corresponds to an M-bit digital word and the components of each information signal correspond to the respective bit positions thereof.

8. A signal processing apparatus according to claim 1, wherein each of said information signals corresponds to an M-bit digital word and the components of each information signal correspond to the respective bit positions thereof.

9. A signal processing apparatus according to claim 8, wherein a respective control signal comprises a respective binary code and wherein each of said stages includes means for producing a respective output bit of said selected one of said N digital words in accordance with a respective relationship between said prescribed binary code and the value of each of the bits of said N digital words associated with a respective one of said M bit positions thereof.

10. A signal processing apparatus according to claim 9, wherein each of said stages comprises a plurality N of controlled bit modifier circuits, each of which is coupled to receive a respective bit of the same respective bit position of a respective digital word among said N digital words and said respective output bit, so as to selectively generate, in accordance with a preselected relationship between said respective bit of said same respective bit position of said respective one of said N digital words and said output bit, an output control bit representative of whether or not that respective digital word is permitted to be said selected one of said digital words.

11. A signal processing apparatus according to claim 10, wherein the output control bits generated by the control bit modifier circuits of the least significant bit representative stage are representative of the location within the multiplicity M of signal component processing stages of the selected one of said M-bit digital words.

12. A signal processing apparatus according to claim 10, wherein each controlled bit modifier circuit includes gate means for selectively providing an output control bit to be coupled to the controlled bit modifier circuit of a lesser significant stage and associated with said same digital word.

13. A signal processing apparatus according to claim 12, wherein each of said controlled bit modifier circuits includes logic means for producing an output bit representative of a predetermined logical operation on a respective bit of a digital word and an output control bit coupled thereto, and wherein said means for producing a respective output bit of said selected one of said N digital words comprises means for combining the N output bits produced by the N controlled bit modifier circuits of said each stage and said prescribed binary code, so as to obtain therefrom said respective output bit.

14. A signal processing apparatus according to claim 13, wherein said combining means comprises means for summing said N output bits to produce a first digital summation code, and means for combining said first digital summation code with said prescribed binary code to produce said respective output bit.

15. A signal processing apparatus according to claim 14, wherein said means for summing said N output bits comprises an N-input arrangement of carry-save adder circuits interconnected to produce said first digital summation code of a bit code length effectively corresponding to that of said prescribed binary code.

16. A signal processing apparatus according to claim 15, wherein said N-input arrangement of carry-save adder circuits comprises a plurality of interconnected stages each of which comprises a plurality of carry-save adder circuits, the interconnections between successive stages of which are in accordance with the binary significance of the bit values being added.

17. A signal processing apparatus according to claim 14, wherein said means for combining said first digital summation code with said prescribed binary code comprises means for adding said first digital summation code to said prescribed binary code to produce a second digital summation code, a first prescribed bit of which corresponds to said respective output bit.

18. A signal processing apparatus according to claim 17, wherein said respective output bit corresponds to the most significant bit of said second digital summation code.

19. A signal processing apparatus according to claim 17, wherein said respective output bit corresponds to the carry bit resulting from the addition of said first digital summation code and said prescribed binary code.

20. A signal processing apparatus according to claim 17, wherein each stage further includes means for selectively coupling one of said prescribed binary codes applied to that respective stage and a preselected portion of said second digital summation code as a binary control code to another stage in accordance with the value of the respective output bit produced by that stage.

21. A signal processing apparatus according to claim 8, wherein said control signal comprises a prescribed binary code representative of the pth largest of said plurality N of M-bit digital words to which the selected one of said M-bit digital words corresponds.

22. A signal processing apparatus according to claim 21, wherein said prescribed binary code is representative of the median of said plurality N of M-bit digital words.

23. A signal processing apparatus according to claim 1, wherein each of said stages includes means for producing a respective component output signal in accordance with a prescribed relationship between said respective control signal and each of the plurality of components of said N information signals associated with a respective one of said M components.

24. A signal processing apparatus according to claim 23, wherein said respective control signal coupling means includes means for selectively prescribing a characteristic of a respective control signal to be coupled to a respective one of said stages in accordance with a respective component output signal of a respective another of said stages.

25. A signal processing apparatus according to claim 23, wherein said respective component output signal producing means includes means for selectively eliminating multi-component information signals from consideration among said plurality N of information signals as possible choices for said selected one of said information signals in accordance with prescribed relationship.

26. A signal processing apparatus according to claim 1, wherein each of said stages comprises a plurality N of signal component processing units, each of which is coupled to receive a respective one of said N information signal components and the output signal component produced by said stage, so as to selectively generate, in accordance with a preselected relationship between said respective one of said information signal components and said output signal component, an output control signal representative of whether or not that respective one of said N information signals is permitted to be said selected one of said information signals.

27. A signal processing apparatus according to claim 26, wherein the output control signals generated by the signal component processing units of a prescribed one of said stages are representative of the location within said multiplicity M of signal component processing stages of said selected one of said multi-component information signals.

28. A signal processing apparatus according to claim 26, further including means for selectively coupling the output control signals produced by signal component processing units of successive stages associated with the same information signal to the corresponding signal component processing unit of at least one other stage, whereby, in response to receipt of an output control signal representing that said same information signal is not permitted to be said selected one of said information signals, each of said successive stage signal component processing units inhibits the respective component of said same information signal received thereby from effectively participating in the producing of said respective component output signal in accordance with said prescribed relationship.

29. A signal processing apparatus according to claim 28, wherein each of said signal component processing means comprises means for producing an output logic signal representative of a predetermined relationship between an output control signal and an information signal component applied thereto, and wherein said means for producing a respective component output signal comprises means for combining the N output logic signals produced by the N signal component processing means of said each stage and said control signal, so as to obtain therefrom said respective component output signal.

30. A signal processing apparatus according to claim 29, wherein said combining means comprises means for summing said N output logic signals to produce a first sum signal, and means for combining said first sum signal with said control signal to produce said respective component output signal.

31. A signal processing apparatus according to claim 30, wherein said means for combining said first sum signal with said control signal comprises means for summing said first sum signal and said control signal to produce a second sum signal a first predetermined component of which corresponds to said respective component output signal.

32. A signal processing apparatus according to claim 31, wherein said control signal coupling means includes means for selectively prescribing a characteristic of a respective control signal to be coupled to a respective one of said stages in accordance with a respective component output signal of a respective another of said stages.

33. A signal processing apparatus according to claim 32, wherein said selectively prescribing means comprises means for selectively coupling one of the respective control signals applied to that respective stage and a second predetermined component of said second sum signal as the respective control signal to another stage in accordance with the respective component output signal produced by that respective stage.

34. An arrangement for orienting the order of N signals and the multiple components thereof in a signal processing apparatus wherein a plurality N of multi (M)-component information signals are successively coupled thereto over M parallel signalling links, comprising:
 a multiplicity M of first delay stages each respective one of which is disposed to be coupled to one of said M parallel signalling links, each first delay stage comprising (N−1) delay elements coupled in series; and
 a mulitplicity M of second delay stages each respective of which is coupled between a respective Kth of said signalling links and a respective Kth one of said first delay stages, each second delay stage comprising (K−1) delay elements coupled in series, where $1<K<M$.

35. An arrangement according to claim 34, wherein each of said information signals corresponds to an M-bit digital word and the components of each information signal correspond to the respective bit positions thereof.

36. An arrangement according to claim 34, wherein the delay times imparted by the delay elements of said first delay stages are such that the Kth signal component of each of said N information signals as coupled over a Kth one of said M parallel signalling lines is provided at the output of a respective one of the delay elements of the Kth first delay stage coupled thereto at the same time.

37. An arrangement according to claim 36, wherein the delay times imparted by the delay elements of said second delay stages are such that the Kth signal component of a respective one of said N information signals is skewed in time relative to a Jth signal component of said respective one of said N information signals, where $1<J<M$ and $J\neq K$.

38. An arrangement according to claim 37, wherein each of said information signals corresponds to an M-bit digital word and the components of each information signal correspond to the respective bit positions thereof.

39. A digital signal processing apparatus for processing a plurality N of M multi-bit digital information signals to produce therefrom a multi-bit digital output signal representative of a controllably selected one of said multi-bit digital information signals comprising:
  a multiplicity M of individual bit processing stages, each respective one of which is associated with a prescribed bit of said multi-bit digital information signals and is coupled to receive that prescribed bit of each of said plurality of multi-bit digital information signals and a respective digital code, so as to produce therefrom that bit of said multi-bit digital output signal that is associated with said prescribed bit of the selected one of said multi-bit digital information signals;
  means, responsive to a variable digital code representative of a selected pth largest of said plurality of N multi-bit digital information signals to which said selected one of said multi-bit digital information signals corresponds, for coupling respective control codes to said multiplicity of signal processing stages; and
  means for combining the respective M bits produced by said multiplicity M of bit processing stages, whereby from said multiplicity M of bit processing stages there is produced said selected one of said multi-bit digital information signals.

* * * * *